(12) United States Patent
Lim et al.

(10) Patent No.: US 9,399,239 B2
(45) Date of Patent: Jul. 26, 2016

(54) SLIT NOZZLE AND LIQUID COATING APPARATUS WITH THE SAME

(71) Applicant: Samsung Display Co., Ltd., Yongin, Gyeonggi-do (KR)

(72) Inventors: Young-In Lim, Cheonan-si (KR); Kyu-Ho Jung, Osan-si (KR); Sang-Hee Choi, Daegu (KR)

(73) Assignee: Samsung Display Co., Ltd., Samsung-ro, Giheung-Gu, Yonging-si, Gyeonggi-Do (KR)

( * ) Notice: Subject to any disclaimer, the term of this patent is extended or adjusted under 35 U.S.C. 154(b) by 0 days.

(21) Appl. No.: 14/451,888

(22) Filed: Aug. 5, 2014

(65) Prior Publication Data

US 2015/0075424 A1    Mar. 19, 2015

(30) Foreign Application Priority Data

Sep. 17, 2013    (KR) .................. 10-2013-0111498

(51) Int. Cl.
| | |
|---|---|
| B05C 5/02 | (2006.01) |
| B05C 11/10 | (2006.01) |
| B05B 1/04 | (2006.01) |
| B05B 3/18 | (2006.01) |
| B05D 1/26 | (2006.01) |
| G03F 7/16 | (2006.01) |

(52) U.S. Cl.
CPC .............. *B05C 5/0254* (2013.01); *B05B 1/044* (2013.01); *B05C 11/10* (2013.01); *B05D 1/26* (2013.01); *G03F 7/16* (2013.01)

(58) Field of Classification Search
None
See application file for complete search history.

(56) References Cited

U.S. PATENT DOCUMENTS

| | | | | |
|---|---|---|---|---|
| 4,748,057 | A | * | 5/1988 | Kageyama et al. ........... 118/410 |
| 4,844,004 | A | * | 7/1989 | Hadzimihalis et al. ....... 118/315 |
| 4,854,262 | A | * | 8/1989 | Chino .................. B05C 5/0254 118/411 |
| 5,639,305 | A | * | 6/1997 | Brown ...................... B05C 3/18 118/410 |
| 6,139,639 | A | * | 10/2000 | Kitamura et al. ............. 118/410 |
| 6,423,144 | B1 | | 7/2002 | Watanabe |
| 2003/0003234 | A1 | * | 1/2003 | Park et al. ..................... 118/416 |
| 2006/0292295 | A1 | * | 12/2006 | Kwon ................ C11D 11/0047 239/568 |

FOREIGN PATENT DOCUMENTS

| | | |
|---|---|---|
| KR | 1020060025690 A | 3/2006 |
| KR | 1020060135428 A | 12/2006 |
| KR | 1020120007327 A | 1/2012 |

* cited by examiner

*Primary Examiner* — Binu Thomas
(74) *Attorney, Agent, or Firm* — Robert E. Bushnell, Esq.

(57) ABSTRACT

A slit nozzle of a liquid coating apparatus which discharges a liquid on a substrate, the slit nozzle includes a first nozzle part, a shim having an outlet configured to discharge the liquid and a second nozzle part facing the first nozzle part with the shim interposed therebetween. At least one of the first nozzle part and the second nozzle part has a sloping portion to prevent the discharged liquid from adhering to the slit nozzle.

7 Claims, 12 Drawing Sheets

MOVING DIRECTION

MOVING DIRECTION

SLIT NOZZLE AND LIQUID COATING APPARATUS WITH THE SAME

CLAIM PRIORITY

This application makes reference to, incorporates the same herein, and claims all benefits accruing under 35 U.S.C. §119 from an application earlier filed in the Korean Intellectual Property Office on 17 Sep. 2013 and there duly assigned Serial No. 10-2013-0111498.

BACKGROUND OF THE INVENTION

1. Field of the Invention

Example embodiments of the inventive concept relate generally to a liquid coating apparatus. More particularly, example embodiments of the inventive concept relate to a slit nozzle and a liquid coating apparatus with the same for coating a liquid onto a substrate or a substrate of an electronic device, a flat panel display device, and the like.

2. Description of the Related Art

A flat panel display device which displays an image by controlling a light is used in various electron devices and various industrial fields because it has various features such as light weight, compact size, high resolution, large screen size, and low power consumption. Typical examples of the flat panel display device are a liquid crystal display (LCD) device, a plasma display panel (PDP) and an organic light emitting display (OLED) device.

A process for coating a liquid such as resin, optically clear adhesive (OCA), photoresist, etc. on a substrate may be performed to manufacture the flat panel display device. Durability and reliability of the flat panel display device may be affected by a coated state (e.g., flatness) of the liquid on the substrate, or by the coating performance of a liquid coating apparatus.

SUMMARY OF THE INVENTION

Some example embodiments provide a slit nozzle

Some example embodiments provide a liquid coating apparatus with the slit nozzle.

According to some example embodiments, a slit nozzle of a liquid coating apparatus that discharges a liquid on a substrate includes a first nozzle part, a shim having an outlet configured to discharge the liquid and a second nozzle part facing the first nozzle part with the shim interposed therebetween, at least one of the first nozzle part and the second nozzle part has a sloping portion to prevent the liquid from adhering to the slit nozzle.

In example embodiments, the sloping portion may have an angle greater than 0 degree and less than 45 degrees with respect to a horizontal plane.

In example embodiments, the first nozzle part may have a first sloping portion having a first angle with respect to a horizontal plane, and the second nozzle part may have a second sloping portion having a second angle with respect to the horizontal plane, and the first angle is different from the second angle.

In example embodiments, the first nozzle part may have an inlet through which the liquid is injected and a storing portion that stores the injected liquid.

In example embodiments, the second nozzle part may have an inlet through which the liquid is injected and a storing portion that stores the injected liquid.

According to some example embodiments, a slit nozzle of a liquid coating apparatus which discharges a liquid on a substrate includes a first nozzle part, a shim having an outlet which is configured to discharge the liquid and a second nozzle part facing the first nozzle part with the shim interposed therebetween, at least one of the first nozzle part and the second nozzle part has an uneven portion to prevent the discharged liquid from adhering to the slit nozzle.

In example embodiments, the uneven portion may have a sawtooth shape.

In example embodiments, the first nozzle part may have an inlet through which the liquid is injected and a storing portion that stores the injected liquid.

In example embodiments, the second nozzle part may have an inlet through which the liquid is injected and a storing portion that stores the injected liquid.

According to some example embodiments, a liquid coating apparatus includes a stage configured to support a substrate, a slit nozzle disposed opposite to the substrate, the slit nozzle including a first nozzle part, a shim having an outlet configured to discharge a liquid, and a second nozzle part facing the first nozzle part with the shim interposed therebetween, at least one of the first nozzle part and the second nozzle part having an adhesion-preventing portion to prevent the discharged liquid from adhering to the slit nozzle and a moving device configured to move the slit nozzle.

In example embodiments, the slit nozzle may move to in a direction to a direction in which the adhesion-preventing portion is formed from a center of the slit nozzle to coat the substrate with the liquid.

In example embodiments, the adhesion-preventing portion may be a sloping portion that is inclined at a predetermined angle with respect to a horizontal plane.

In example embodiments, the predetermined angle may be greater than 0 degree and less than 45 degrees with respect to the horizontal plane.

In example embodiments, the adhesion-preventing portion may be an uneven portion.

In example embodiments, the uneven portion may have a sawtooth shape.

In example embodiments, the first nozzle part may have an inlet through which the liquid is injected, and a storing portion that stores the injected liquid.

In example embodiments, the second nozzle part may have an inlet through which the liquid is injected, and a storing portion that stores the injected liquid.

Therefore, a slit nozzle and a liquid coating apparatus having the slit nozzle according to example embodiments may have an adhesion-preventing portion (e.g., a sloping portion or an uneven portion), and thus may uniformly coat a substrate with a liquid.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
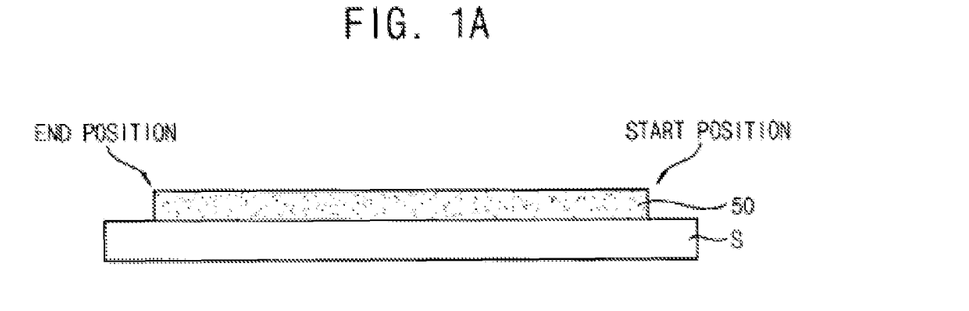
FIGS. 1A through 1C are diagrams illustrating cross-sectional views of examples of shapes of liquids coated on substrates.
Figure 1B:
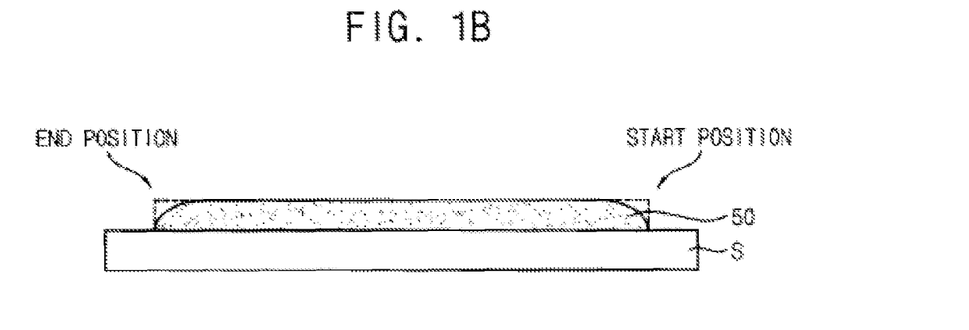
Figure 1C:
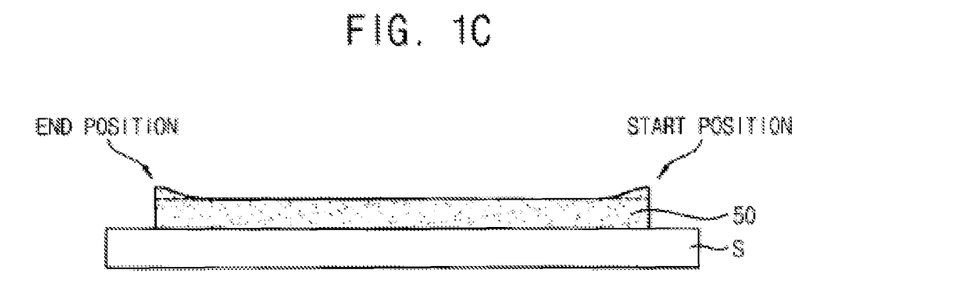

FIGS. 1A through 1C are diagrams illustrating examples of cross-sectional shapes of liquids 50 coated on substrates S.

A liquid 50 may be a material such as a resin, an optically clear adhesive (OCA), a photoresist, etc. The liquid 50 may be coated on an organic or inorganic substrate, such as a glass substrate, metal-based substrate, a polymer-based substrate, a display panel, circuit board, mechanical or electronic parts of a device, etc.

As illustrated in FIG. 1A, when the liquid 50 is coated on a substrate S, it is desirable that the liquid 50 is formed in a rectangular cross-sectional shape. For example, the liquid 50 may be a hardening resin which bonds a display substrate and a window panel. When the liquid 50 is formed in the rectangular cross-sectional shape with a uniform thickness, durability and reliability may be improved by superior adhesive strength. In other examples, the liquid 50 may be a photoresist. When the liquid 50 is formed in the rectangular cross-sectional shape with the uniform thickness, display quality may be improved because the liquid 50 is smoothly formed in a display area which displays an image. The shape of the liquid 50 may be determined by a shape of a nozzle such as the outlet shape and a material forming the nozzle which discharges the liquid 50.

As illustrated in FIG. 1B, when the nozzle applies the liquid 50 to the substrate S to coat the substrate S with the liquid 50, the liquid 50 may be insufficiently applied to the substrate S at a position where the application of the liquid 50 is started or at a position where the application of the liquid 50 is ended. For example, when the liquid 50 is discharged on the substrate S from the nozzle, the discharged liquid 50 may adhere to the nozzle due to a surface tension. When the nozzle starts to discharge the liquid 50, the discharged liquid 50 may adhere to the nozzle, and thus the liquid 50 may be insufficiently applied at the position where the application of the liquid 50 is started. Further, when the nozzle moves away from the substrate S after the application of the liquid 50 is completed, the liquid 50 may further adhere to the nozzle, and thus the liquid 50 may be insufficiently applied at the position where the application of the liquid 50 is ended.

For example, the liquid 50 may be the hardening resin which bonds the display substrate and the window panel of a display device. In this case, if the liquid 50 is insufficiently applied at the start position and/or the end position, durability and reliability of the display device may be deteriorated due to inferior adhesive strength of the hardening resin. In other examples, the liquid 50 may be the photoresist. In this case, if the liquid 50 is insufficiently applied at the start position and/or the end position, a strain defect and a light leakage defect may occur because the liquid 50 is unevenly formed in the display area.

As illustrated in FIG. 1C, when the nozzle applies the liquid 50 to the substrate S to coat the substrate S with the liquid 50, the liquid 50 may be excessively applied at a position where the application of the liquid 50 is started or at a position where the application of the liquid 50 is ended. For example, when the nozzle starts to discharge the liquid 50, the discharged liquid 50 may ascend a sloping portion of the nozzle due to a surface tension, and thus may be remained at the position where the application of the liquid 50 is started. Further, when the nozzle moves away from the substrate S after the application of the liquid 50 is completed, the liquid 50 that has ascended the sloping portion of the nozzle may be remained at the position where the application of the liquid 50 is ended.

For example, the liquid 50 may be the hardening resin which bonds the display substrate and the window panel of a display device. In this case, if the liquid 50 is excessively applied at the start position and/or the end position, adhesive strength of the hardening resin and display quality of the display device may be affected by the overflow of the liquid 50. In other example embodiments, the liquid 50 may be the photoresist. In this case, if the liquid 50 is excessively applied at the start position and/or the end position, the strain defect and the light leakage defect may occur because the liquid 50 is unevenly formed in the display area.

Figure 2:
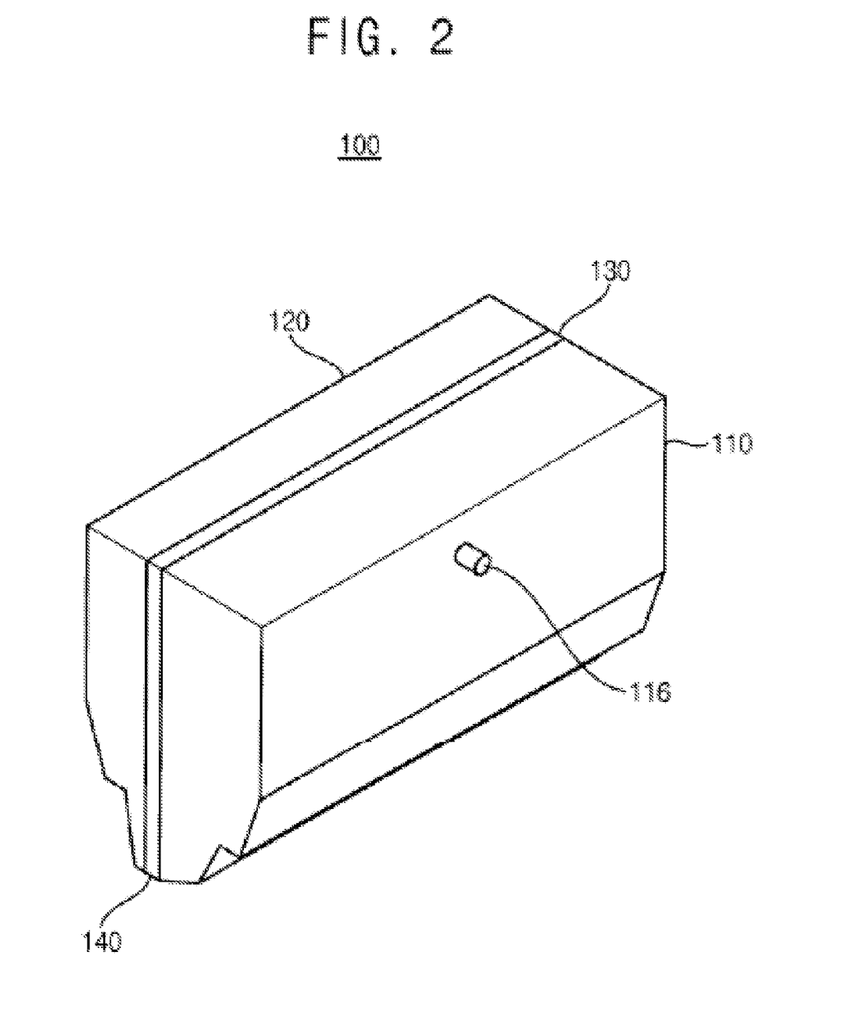
FIG. 2 is a perspective view illustrating a slit nozzle according to example embodiments.
Figure 3:
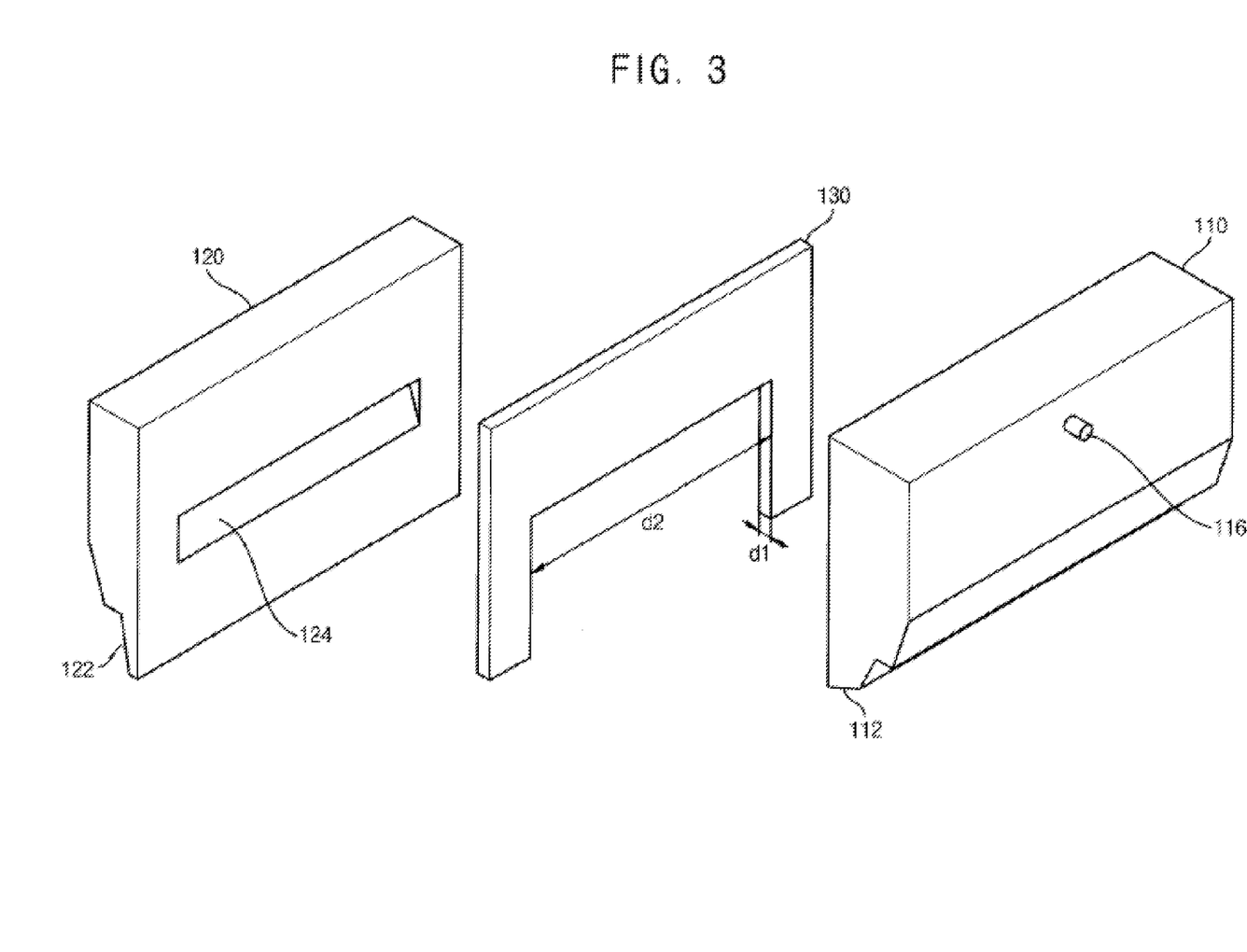
FIG. 3 is an exploded perspective view illustrating a slit nozzle of FIG. 2.
Figure 4:
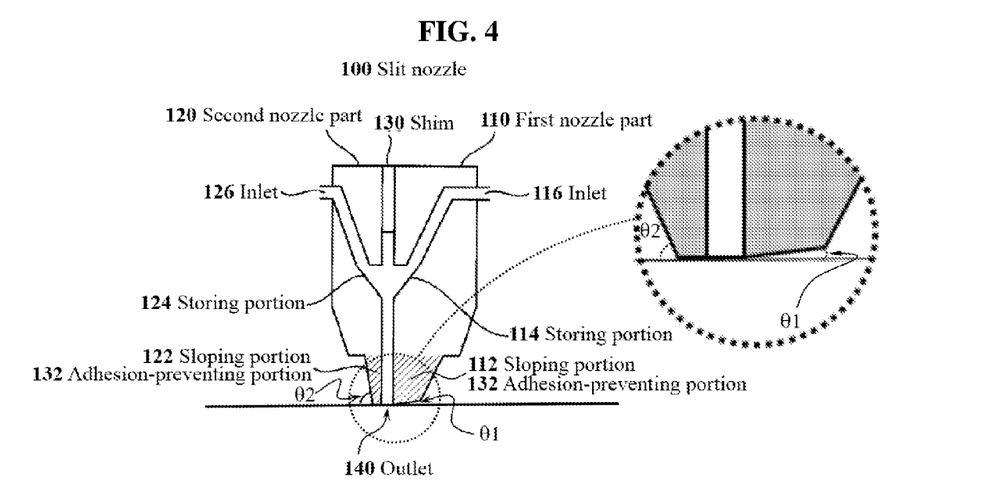
FIG. 4 is a cross-sectional view illustrating a slit nozzle of FIG. 2.
Figure 5:
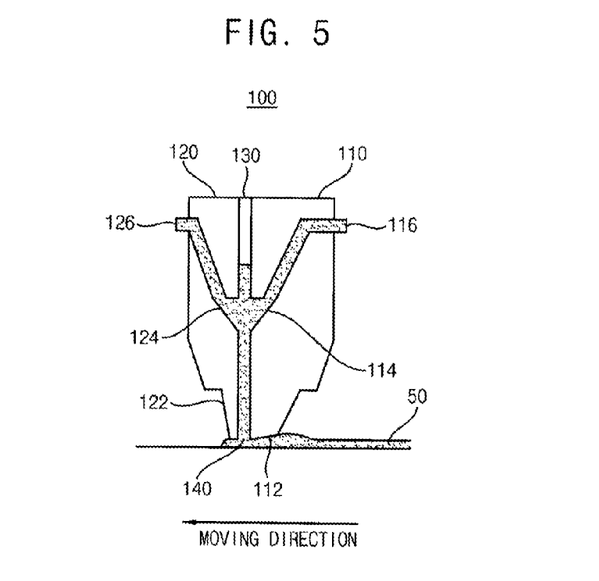
FIG. 5 is a diagram illustrating an example in which a liquid is coated on a substrate by a slit nozzle of FIG. 2.

FIG. 2 is a perspective view illustrating a slit nozzle according to example embodiments, FIG. 3 is an exploded perspective view illustrating a slit nozzle of FIG. 2, FIG. 4 is a cross-sectional view illustrating a slit nozzle of FIG. 2, and FIG. 5 is a diagram illustrating an example in which a liquid is coated on a substrate by a slit nozzle of FIG. 2.

Referring to FIGS. 2 through 4, the slit nozzle 100 may include a first nozzle part 110, a shim 130 and a second nozzle part 120.

The first nozzle part 110 and the second nozzle part 120 may be disposed facing each other with the shim 130 interposed therebetween. An outlet 140 may be formed at the bottom of the shim 130, and the outlet 140 may have a rectangular opening through which a liquid is discharged. A width d1 of the outlet 140 may be determined by a thickness of the shim 130, and a length d2 of the outlet 140 may be determined by a length of the opening formed in the shim 130. A quantity and a shape of the coated liquid on the substrate may be changed according to the width d1 and the length d2 of the outlet 140. Thus, the shim 130 may be changed according to a kind of the liquid and a size of the substrate. The first nozzle part 110, the second nozzle part 120 and the shim 130 may be combined using a mechanical fastener or adhesive or both.

Each of the first and second nozzle parts 110 and 120 may include an inlet 116 and 126 through which the liquid is injected and a storing portion 114 and 124 that store the injected liquid. The inlet 116 and 126 may be formed on one side of each of the first and second nozzle parts 110 and 120. The liquid may be injected to the inlet 116 and 126 from a providing part. The storing portion 114 and 124 may temporarily store the liquid to continuously discharge the stored liquid through the outlet 140. The storing portion 114 and 124 may be widely composed in the center of the first nozzle part 110 and the second nozzle part 120, and may be coupled to an external pressing device to discharge the liquid smoothly. The inlet 116 and 126 and the storing portion 114 and 124 may have various shape and composition according to a kind of the liquid.

At least one sloping portion 112 and 122 may be formed in at least one of the first nozzle part 110 and the second nozzle part 120 to prevent the liquid 50 from adhering to the slit nozzle 100. The sloping portion 112 may have an angle greater than about 0 degree and less than about 10 degrees with respect to a horizontal plane. For example, as illustrated in FIG. 4, the first nozzle part 110 may have a first sloping portion 112 which may be an adhesion-preventing portion 132 and having an angle $\theta1$ with respect to a horizontal plane to prevent the liquid 50 from adhering to the slit nozzle 100, and the angle $\theta1$ of the first sloping portion 112 may be greater than about 0 degree and less than about 10 degrees. Further, the second nozzle part 120 may have a second sloping portion 122 which may be an adhesion-preventing portion 132 and having an angle $\theta2$ with respect to the horizontal plane, and the angle $\theta2$ of the second sloping portion 122 may be different from the angle $\theta1$ of the first sloping portion 112. For example, the angle $\theta2$ of the second sloping portion 122 may be greater than 0 degree and less than 45 degrees, but is not limited thereto.

As illustrated in FIG. 5, when the slit nozzle 100 moves in a direction (e.g., MOVING DIRECTION), the sloping portion 112 having the angle $\theta1$ greater than about 0 degree and less than about 10 degrees may be formed at the first nozzle part 110 located in a direction opposite to the moving direction of the slit nozzle 100 from the center of the slit nozzle 100. A height of the liquid 50 which adheres to the slit nozzle 100 may be reduced by forming the sloping portion 112 at the first nozzle part 110 opposite to a moving direction of the slit nozzle 100.

Figure 6:
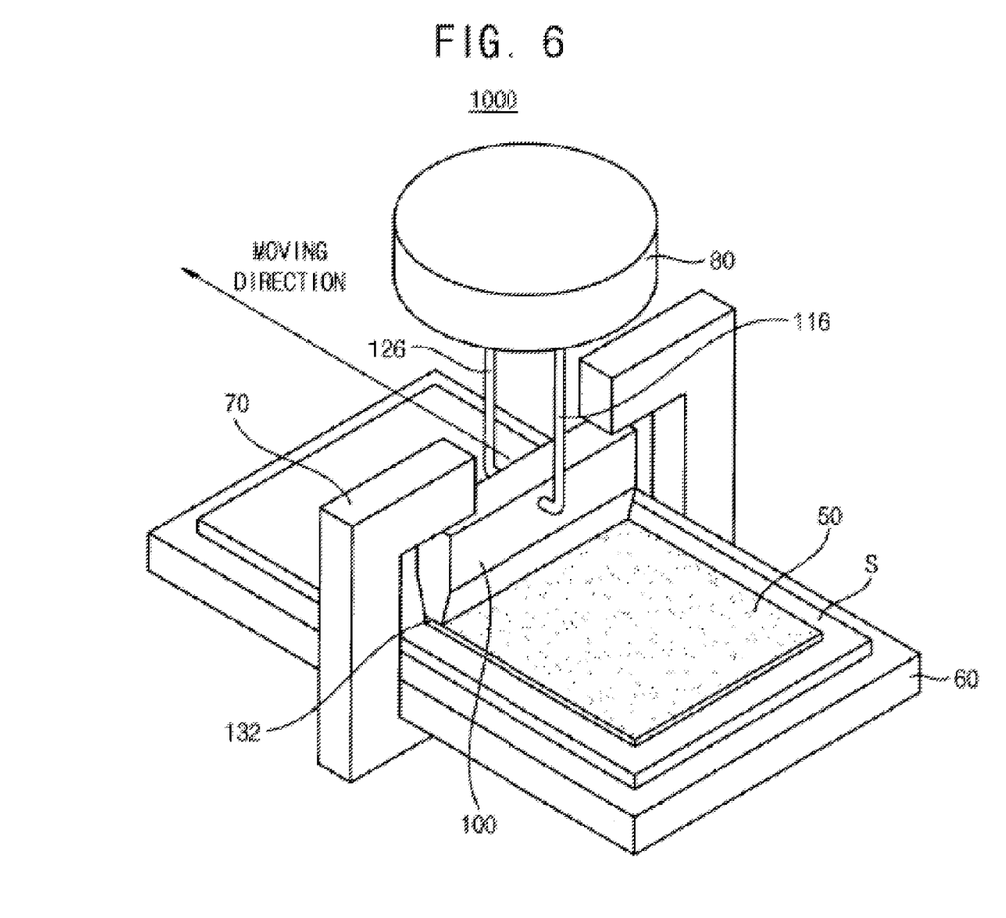
FIG. 6 is a perspective view illustrating a liquid coating apparatus including a slit nozzle of FIG. 2.
Figure 7:
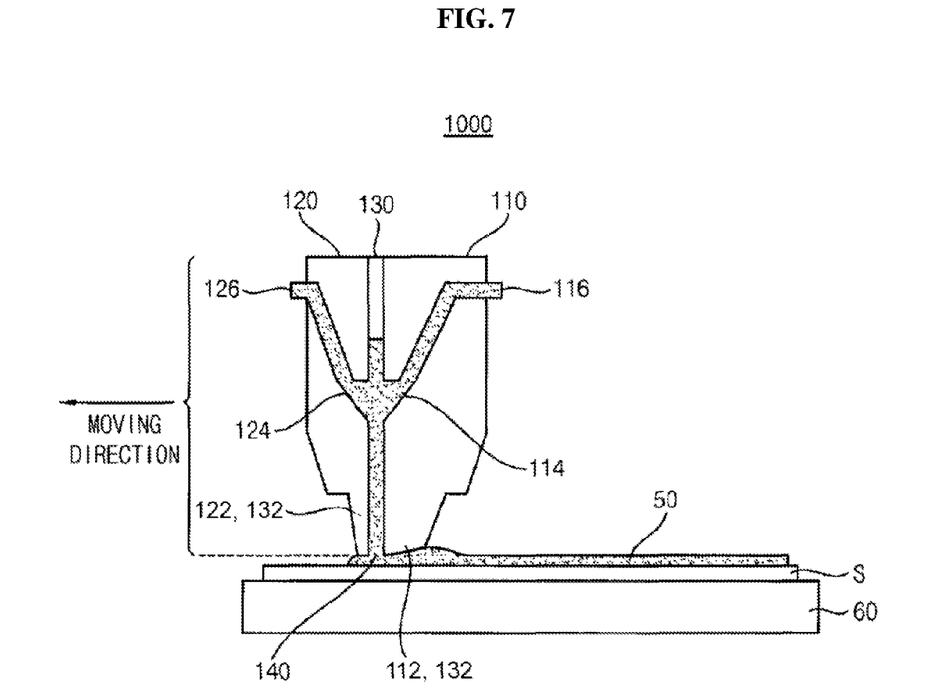
FIG. 7 is a diagram illustrating an example in which a liquid is coated on a substrate using a liquid coating apparatus of FIG. 6.

FIG. 6 is a perspective view illustrating a liquid coating apparatus including a slit nozzle of FIG. 2 and FIG. 7 is a diagram illustrating an example in which a liquid is coated on a substrate using a liquid coating apparatus of FIG. 6.

Referring to FIGS. 6 and 7, a liquid coating apparatus 1000 may include a stage 60, a slit nozzle 100 and a moving device 70.

The stage 60 may support the substrate S on which the liquid is coated. The substrate S may be one of a glass substrate, a plastic substrate and a display panel. The substrate S is disposed on the stage 60, and a plurality of pins may be installed on the surface of the stage 60 to lift the substrate S. A plurality of vacuum absorbers may be formed on the stage 60 to absorb the substrate S. Thus, the substrate S may be maintained in parallel state during a process. The stage 60 may be manufactured in various structures according to a shape and a size of the substrate S.

The slit nozzle 100 has the outlet 140 and discharges the liquid 50 to the substrate S. The slit nozzle 100 may include the first nozzle part 110, the shim 130, the second nozzle part 120, and an adhesion-preventing portion 132 that prevents the liquid 50 from adhering to the slit nozzle 100. The adhesion-preventing portion 132 may be formed in at least one of the first nozzle part 110 and the second nozzle part 120. The adhesion-preventing portion 132 may be a sloping portion (for example, a first sloping portion 112) that is inclined at a predetermined angle with respect to the horizontal plane. Here, the predetermined angle may be greater than about 0 degree and less than about 10 degrees with respect to the horizontal plane. For example, as illustrated in FIG. 7, the first nozzle part 110 may have the first sloping portion 112 having the angle greater than about 0 degree and less than about 10 degrees with respect to the horizontal plane. When the slit nozzle 100 moves in a direction, the first nozzle part 110 including the first slope portion 112 may be disposed in a direction opposite to the moving direction of the slit nozzle 100. Thus, the first sloping portion 112 having the angle greater than about 0 degree and less than about 10 degree may reduce the height of the liquid 50 which adheres to the slit nozzle 100. Accordingly, the liquid 50 may be uniformly coated on the substrate S.

Each of the first and second nozzle parts 110 and 120 may include an inlet 116 and 126 through which the liquid 50 is injected, and a storing portion 114 and 124 that store the injected liquid 50. The inlets 116 and 126 may be coupled to a providing part 80 of the liquid coating apparatus 1000. The providing part 80 may include an external pressing device to provide the liquid 50 smoothly to the slit nozzle 100, and a control device to control the discharging quantity and discharging speed of the liquid 50. The liquid coating apparatus 1000 illustrated in FIG. 6 has only one providing part 80, but the providing part 80 may be respectively coupled to the inlet 116 of the first nozzle part and the inlet 126 of the second nozzle part 120. The storing portions 114 and 124 may temporarily store the injected liquid 50 to continuously discharge the liquid through the outlet 140. The storing portions 114 and 124 may be coupled to an external pressing device to discharge the liquid smoothly.

The moving device 70 may move the slit nozzle 100 which is over the substrate S in a direction (e.g., MOVING DIRECTION). The adhesion-preventing portion 132 may be located in a direction opposite to the moving direction of the slit nozzle 100 from the center of the slit nozzle 100 The moving device 70 may form the liquid layer at uniform thickness by moving the slit nozzle 100 which discharges the liquid 50 at constant quantity and constant speed. The moving device 70 may be composed by a motor, a moving rail and a guide rail.

As described, at least one of the first nozzle part 110 and the second nozzle part 120 of the liquid coating apparatus 1000 may have the adhesion-preventing portion 132. The adhesion-preventing portion 132 may be the sloping portion 112 which has the angle greater than about 0 degree and less than about 10 degrees with respect to the horizontal plane. The first nozzle part 110 which has the sloping portion 112 may be disposed opposite to the moving direction of the slit nozzle 100. The liquid 50 may be uniformly coated on the substrate S because the height of the liquid 50 which adheres to the slit nozzle may be reduced by the sloping portion 112 of the first nozzle part 110.

Figure 8:
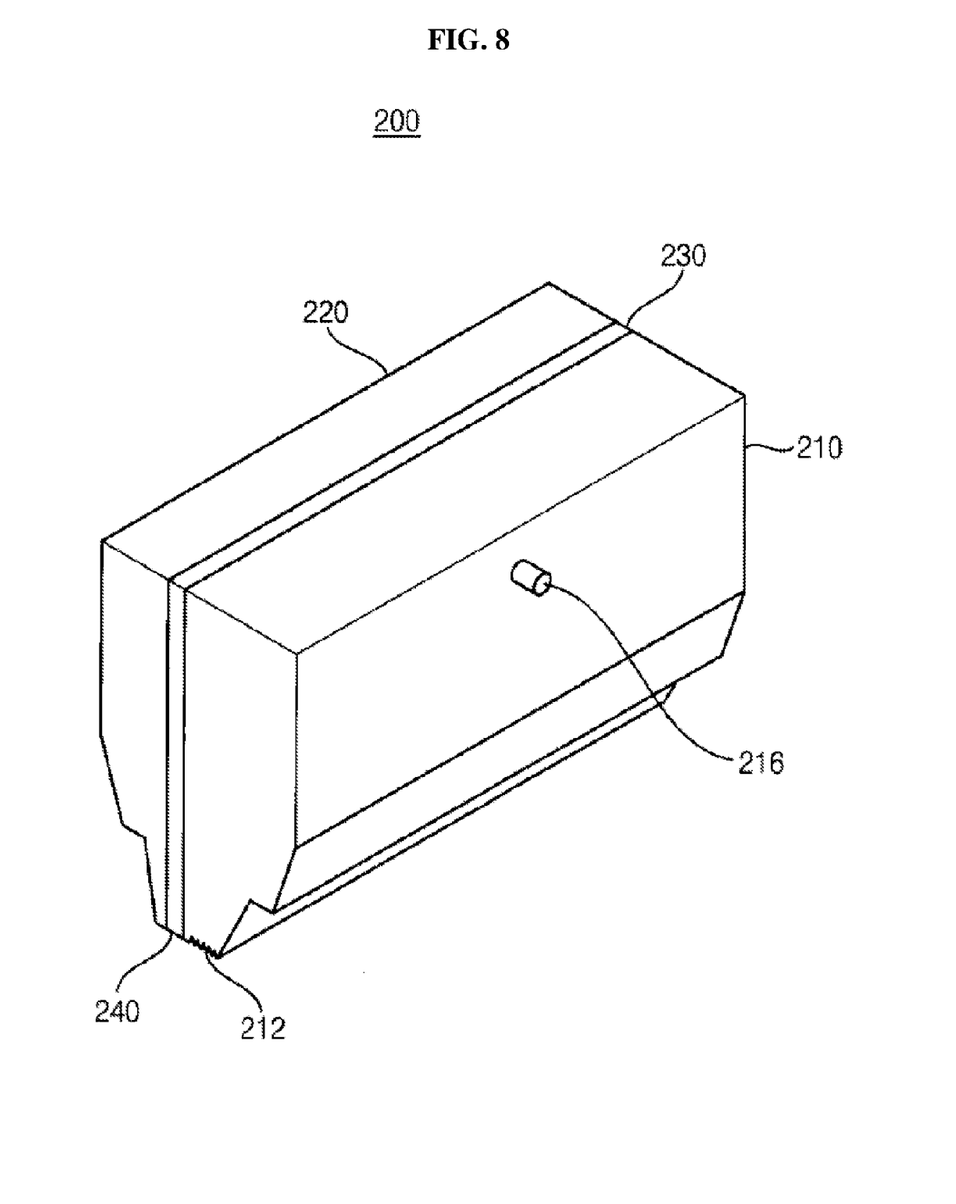
FIG. 8 is a perspective view illustrating a slit nozzle according to example embodiments.
Figure 9:
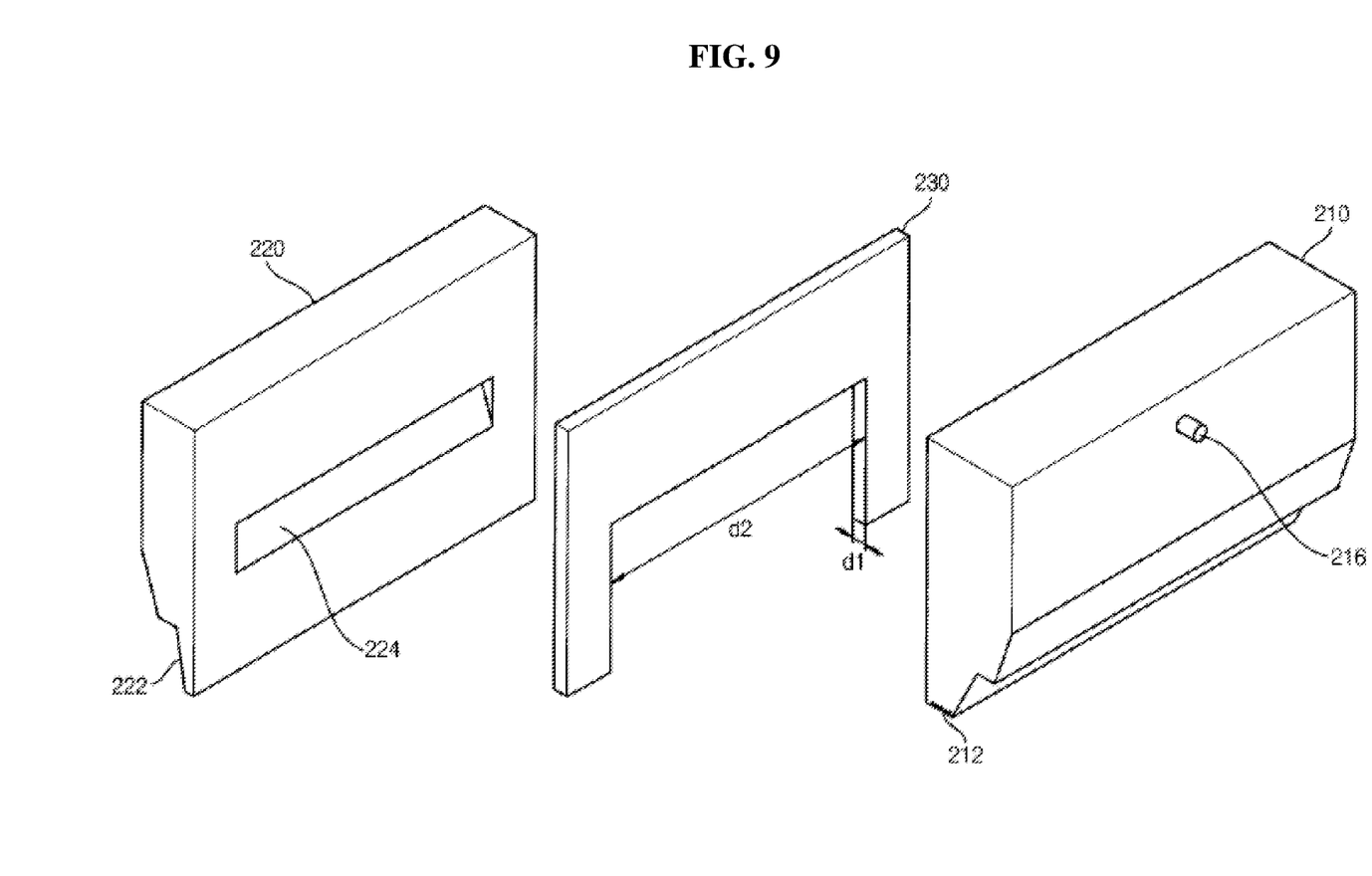
FIG. 9 is an exploded perspective view illustrating a slit nozzle of FIG. 8.
Figure 10:
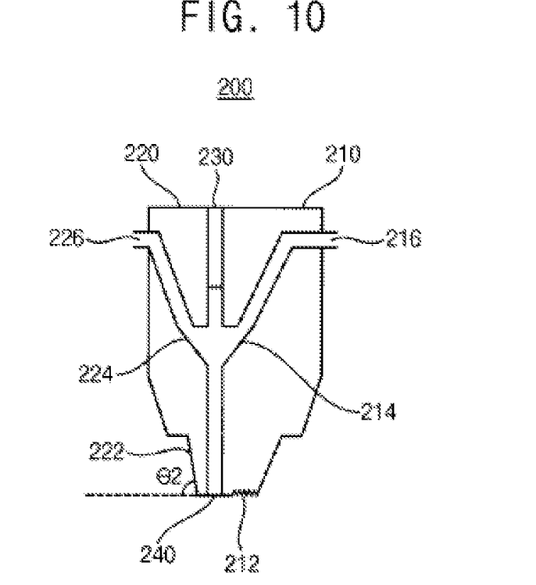
FIG. 10 is a cross-sectional view illustrating a slit nozzle of FIG. 8.
Figure 11:
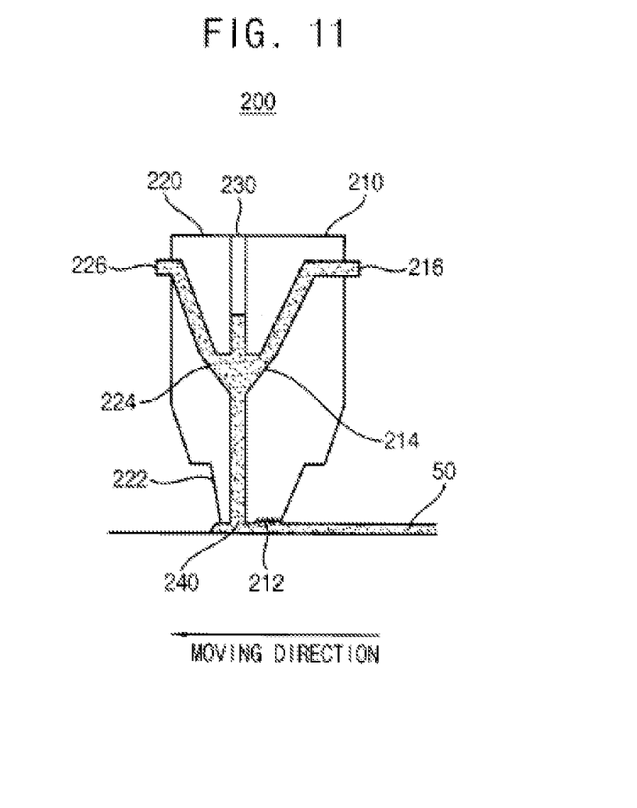
FIG. 11 is a diagram illustrating an example in which a liquid is coated on a substrate by a slit nozzle of FIG. 8.

FIG. 8 is a perspective view illustrating a slit nozzle according to example embodiments, FIG. 9 is an exploded perspective view illustrating a slit nozzle of FIG. 8, FIG. 10 is a cross-sectional view illustrating a slit nozzle of FIG. 8, and FIG. 11 is a diagram illustrating an example in which a liquid is coated on a substrate by a slit nozzle of FIG. 8.

Referring to FIGS. 8 through 11, a slit nozzle 200 may include a first nozzle part 210, a shim 230 and a second nozzle part 220.

The first nozzle part 210 and the second nozzle part 220 may be disposed facing each other with the shim 230 interposed therebetween. An outlet 240 may be formed at the bottom of the shim 130, and the outlet 140 may have a rectangular opening through which a liquid is discharged. A width d1 of the outlet 240 may be determined by a thickness of the shim 230, and a length d2 of the outlet 240 may be determined by a length of the opening formed in the shim 230. A quantity and a shape of the coated liquid on the substrate may be changed according to the width d1 and the length d2 of the outlet 240. Thus, the shim 230 may be changed according to a kind of the liquid and a size of the substrate. The first nozzle part 110, the second nozzle part 120 and the shim 130 may be combined using a mechanical fastener or adhesive or both.

Each of the first and second nozzle parts 210 and 220 may include an inlet 216 and 226 through which the liquid is injected and a storing portion 214 and 224 that store the injected liquid. The inlet 216 and 226 may be formed on one side of each of the first and second nozzle parts 210 and 220. The liquid may be injected to the inlet 116 and 126 from a providing part. The storing portion 214 and 224 may temporarily store the liquid to continuously discharge the stored liquid through the outlet 140. The storing portions 214 and 224 may be widely composed in the center of the first nozzle part 210 and the second nozzle part 220, and may be coupled to an external pressing device to discharge the liquid smoothly. The inlet 116 and 126 and the storing portion 114 and 124 may have various shape and composition according to a kind of the liquid.

At least one an uneven portion 212 may be formed at least one of the first nozzle part 210 and the second nozzle part 220 to prevent the liquid 50 from adhering to the slit nozzle 200. The uneven portion 212 may have a sawtooth shape. For example, as illustrated in FIG. 10, the first nozzle part 210 may have the uneven portion 212 to prevent the liquid 50 from adhering to the slit nozzle 200. Further, the second nozzle part 220 may have the second sloping portion 222 having an angle is θ2 with respect to the horizontal plane. For example, the angle θ2 of the second sloping portion 222 may be greater than 0 degree and less than 45 degree, but is not limited thereto.

As illustrated in FIG. 11, when the slit nozzle 200 moves in a direction (e.g. MOVING DIRECTION), the uneven portion 212 may be formed at the first nozzle part 210 located in a direction opposite to the moving direction of the slit nozzle 200 from the center of the slit nozzle 200. A height of the liquid 50 which adheres to the slit nozzle 200 may be reduced by forming the uneven portion 212 at the first nozzle part 210 opposite to the moving direction of the slit nozzle 200. Further, the adhered liquid 50 may be easily detached from the first nozzle part 210 because of the uneven portion 212.

Figure 12:
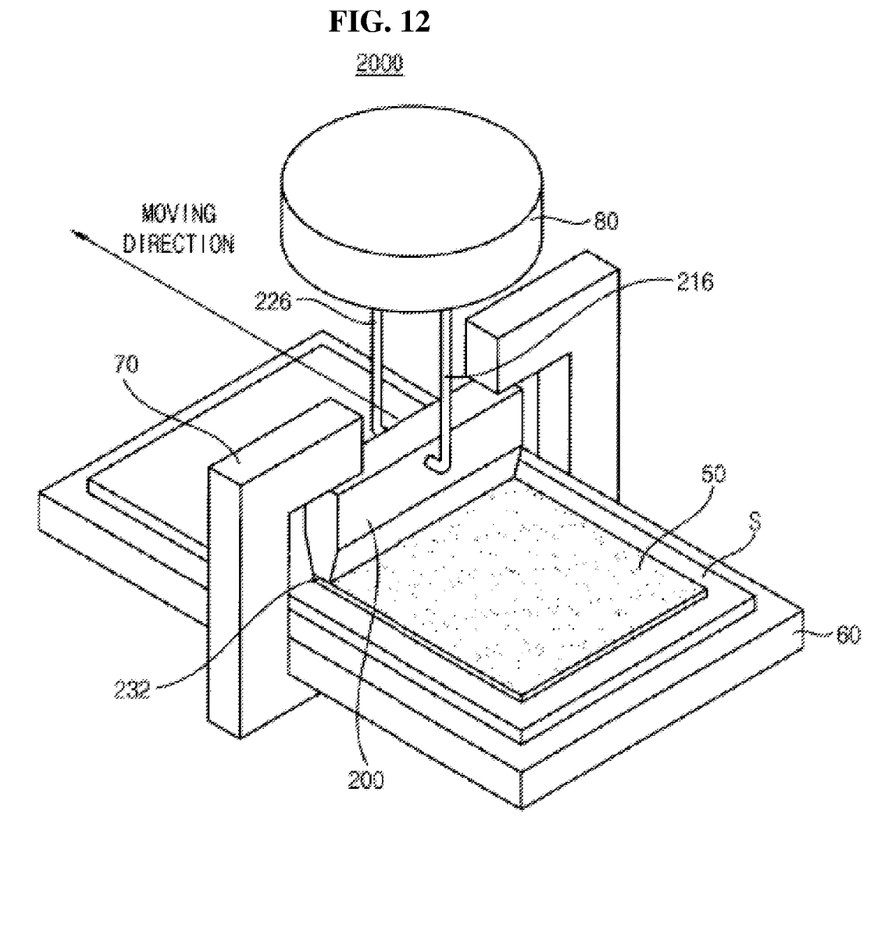
FIG. 12 is a perspective view illustrating a liquid coating apparatus including a slit nozzle of FIG. 8.
Figure 13:
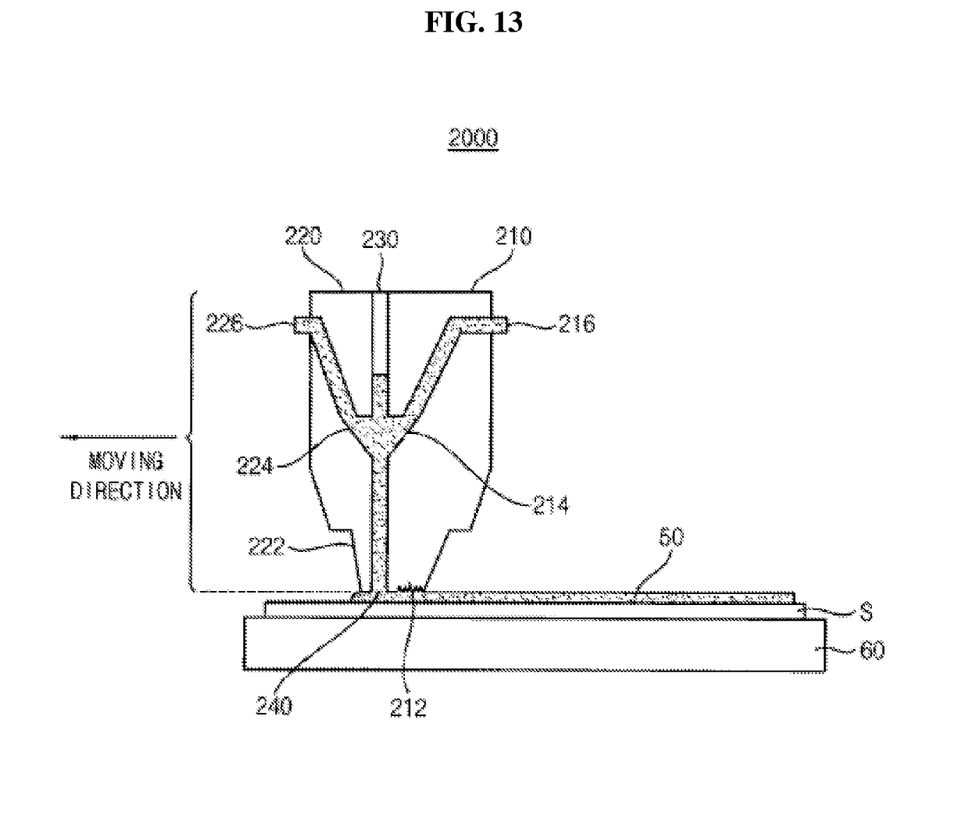
FIG. 13 is a diagram illustrating an example in which a liquid is coated on a substrate using a liquid coating apparatus of FIG. 12.

FIG. 12 is a perspective view illustrating a liquid coating apparatus including a slit nozzle of FIG. 8 and FIG. 13 is a diagram illustrating an example in which a liquid is coated on a substrate using a liquid coating apparatus of FIG. 12.

Referring to FIGS. 12 and 13, the liquid coating apparatus 1000 may include the stage 60, the slit nozzle 200 and the moving device 70.

The stage 60 may support the substrate S on which the liquid is coated. The substrate S may be one of the glass substrate, the plastic substrate and the display panel. The substrate S is disposed on the stage 60, and a plurality of pins may be installed on the surface of the stage 60 to lift the substrate S. A plurality of vacuum absorber may be formed on the stage 60 to absorb the substrate S. Thus, the substrate S may be maintained in parallel state during a process. The stage 60 may be manufactured in various structures according to a shape and a size of the substrate S.

The slit nozzle 200 has the outlet 240 and discharges the liquid 50 to the substrate S. The slit nozzle 200 may include the first nozzle part 210, the shim 230, the second nozzle part 220, and an adhesion-preventing portion 232 that prevents the liquid 50 from adhering to the slit nozzle 200. The adhesion-preventing portion 232 may be formed in at least one of the first nozzle part 210 and the second nozzle part 220. The adhesion-preventing portion 232 may be the uneven portion that has a sawtooth shape. For example, as illustrated in FIG. 13, the first nozzle part 210 may have the uneven portion 212 having a sawtooth shape. When the slit nozzle 200 moves in a direction, the first nozzle part 210 including the uneven portion 212 may be disposed in a direction opposite to the moving direction of the slit nozzle 200. Thus, the uneven portion 212 having the sawtooth shape may reduce the height of the liquid 50 which adheres to the slit nozzle 200. Further, the liquid 50 may be easily detached from the uneven portion 212 of the first nozzle part 210. Accordingly, the liquid 50 may be uniformly coated on the substrate S.

Each of the first and the second nozzle part 210 and 220 may include an inlet 216 and 226 through which the liquid 50 is injected, and a storing portion 214 and 224 that store the injected liquid 50. The inlets 216 and 226 may be coupled to the providing part 80 of the liquid coating apparatus 2000. The providing part 80 may include an external pressing device to provide the liquid 50 smoothly to the slit nozzle 200, and the control device to control the discharging quantity and discharging speed of the liquid 50. The liquid coating apparatus 2000 illustrated in FIG. 12 has only one providing part 80, but the providing part 80 may be respectively coupled to the inlet 216 of the first nozzle part and the inlet 226 of the second nozzle part 220. The storing portions 214 and 224 may temporarily store the injected liquid 50 to continuously discharge the liquid through the outlet 140. The storing portions 214 and 224 may be coupled to an external pressing device to discharge the liquid smoothly.

The moving device 70 may move the slit nozzle 200 which is over the substrate S in a direction (e.g., MOVING DIRECTION). The adhesion-preventing portion 232 may be located in a direction opposite to the moving direction of the slit nozzle 200 from the center of the slit nozzle 200. The moving device 70 may form the liquid layer at uniform thickness by moving the slit nozzle 200 which discharges the liquid 50 at constant quantity and constant speed. The moving device 70 may be composed by the motor, the moving rail and the guide rail.

As described, at least one of the first nozzle part 210 and the second nozzle part 220 of the liquid coating apparatus 2000 may have the adhesion-preventing portion 232. The adhesion-preventing portion 232 may be the uneven portion 212 which has the sawtooth shape. The first nozzle part 210 which has the uneven portion 212 may be disposed opposite to the moving direction of the slit nozzle 200. The height of the liquid 50 which adheres to the slit nozzle may be reduced by the uneven portion 212 of the first nozzle part 210. Further, the adhered liquid 50 may be easily detached from the first nozzle part 210 because of the uneven portion 212. Thus, the liquid 50 may be uniformly coated on the substrate S.

Figure 14:
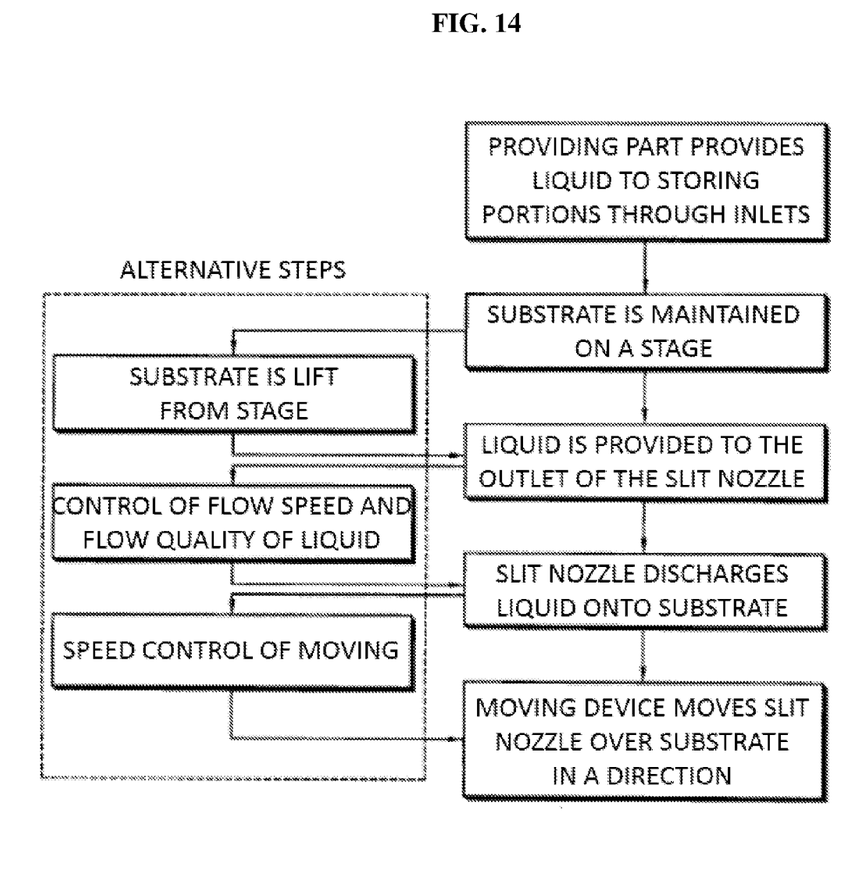
FIG. 14 is a flowchart showing the steps of coating a liquid 50 onto a substrate using the slit nozzle 200.

FIG. 14 shows a flow chart of the process of coating a liquid 50 onto a substrate S using the aforementioned slit nozzle 200. In the process, the providing part 80 provides the liquid 50 to the inlets and the liquid 50 flows into a storing portion inside the slit nozzle. The liquid 50 is then discharged from the slit nozzle onto a substrate disposed on a stage, with alternative control of flow speed and flow quantity. Moving device 70 moves the slit nozzle in a direction, with an alternative control of moving speed to a constant speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A slit nozzle of a liquid coating apparatus which discharges a liquid on a substrate, the slit nozzle comprising:
    a first nozzle part;
    a shim having an outlet configured to discharge the liquid; and
    a second nozzle part facing the first nozzle part with the shim interposed therebetween,
    at least one of the first nozzle part and the second nozzle part having
        a flat surface adjacent to the outlet, and
        an uneven portion having a sawtooth shape adjacent to the flat surface, and spaced apart from the outlet by the flat surface to discourage the discharged liquid from adhering to the slit nozzle.

2. The slit nozzle of claim 1, further comprised of the first nozzle part having an inlet through which the liquid is injected and a storing portion that stores the injected liquid.

3. The slit nozzle of claim 1, further comprised of the second nozzle part having an inlet through which the liquid is injected and a storing portion that stores the discharged liquid.

4. A liquid coating apparatus comprising:
    a stage configured to support a substrate;
    a slit nozzle disposed opposite to the substrate, the slit nozzle including
        a first nozzle part,
        a shim having an outlet configured to discharge a liquid, and
        a second nozzle part facing the first nozzle part with the shim interposed there between,
        at least one of the first nozzle part and the second nozzle part having
            a flat surface adjacent to the outlet, and
            an uneven portion having a sawtooth shape adjacent to the flat surface, and spaced apart from the outlet by the flat surface to discourage the discharged liquid from adhering to the slit nozzle; and
    a moving device configured to move the slit nozzle.

5. The apparatus of claim 4, further comprised of the slit nozzle being moved toward a direction opposite to a direction from a center of the slit nozzle to the uneven portion to coat the substrate with the liquid.

6. The apparatus of claim 4, further comprised of the first nozzle part having an inlet through which the liquid is injected, and a storing portion that stores the injected liquid.

7. The apparatus of claim 4, further comprised of the second nozzle part having an inlet through which the liquid is injected, and a storing portion that stores the injected liquid.

* * * * *